United States Patent [19]

Mahawili

[11] Patent Number: 4,673,799
[45] Date of Patent: Jun. 16, 1987

[54] FLUIDIZED BED HEATER FOR SEMICONDUCTOR PROCESSING

[75] Inventor: Imad Mahawili, Sunnyvale, Calif.

[73] Assignee: Focus Semiconductor Systems, Inc., Sunnyvale, Calif.

[21] Appl. No.: 707,262

[22] Filed: Mar. 1, 1985

[51] Int. Cl.[4] .................. C23C 16/48; C23C 16/44
[52] U.S. Cl. ......................... 219/399; 118/724; 118/725
[58] Field of Search ............... 219/399, 400; 118/724, 118/725, DIG. 5; 122/4 D; 110/245

[56] References Cited

U.S. PATENT DOCUMENTS

| | | | |
|---|---|---|---|
| 3,608,519 | 9/1971 | Bean | 118/725 |
| 3,918,396 | 11/1975 | Dietze et al. | 118/725 |
| 4,096,909 | 6/1978 | Jukkola | 122/4 D X |
| 4,299,562 | 11/1981 | Harman | 122/4 D X |
| 4,343,352 | 8/1982 | Bockman et al. | 122/4 D X |
| 4,419,332 | 12/1983 | von der Ropp | 118/725 X |
| 4,522,149 | 6/1985 | Garbis et al. | 118/725 |

Primary Examiner—Howard N. Goldberg
Assistant Examiner—Taylor J. Ross
Attorney, Agent, or Firm—Alan H. MacPherson; Steven F. Caserza; Richard Franklin

[57] ABSTRACT

A fluidized bed heater for uniformly raising the surface temperature of semiconductor wafers. The heater includes a mantle having at least one planar surface for supporting wafers, a bed of particles adjacent the mantle which is fluidized by passing a gas through the particle bed, and a bed heater which heats the bed particles to a uniform temperature so that wafers supported on the planar surface are heated to a uniform temperature. A reactor is also described which contains a reactor chamber for processing semiconductor wafers and a fluidized bed heater for uniformly heating semiconductor wafers in the reactor chamber.

5 Claims, 7 Drawing Figures

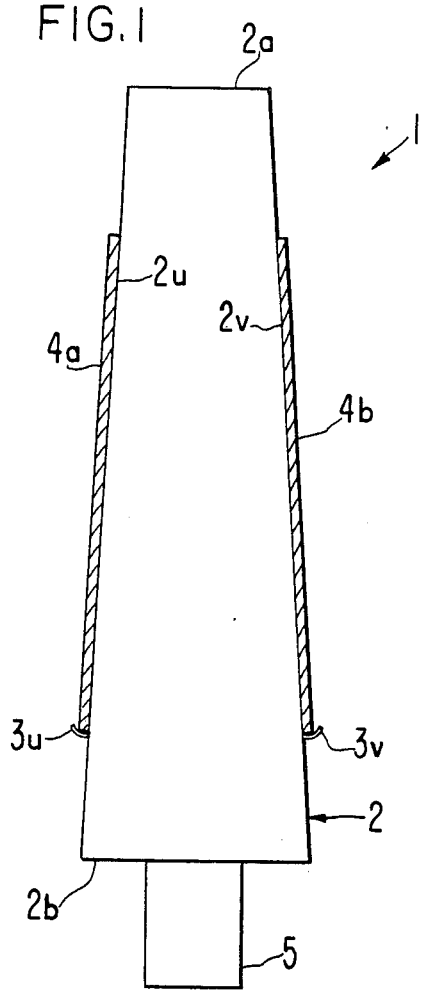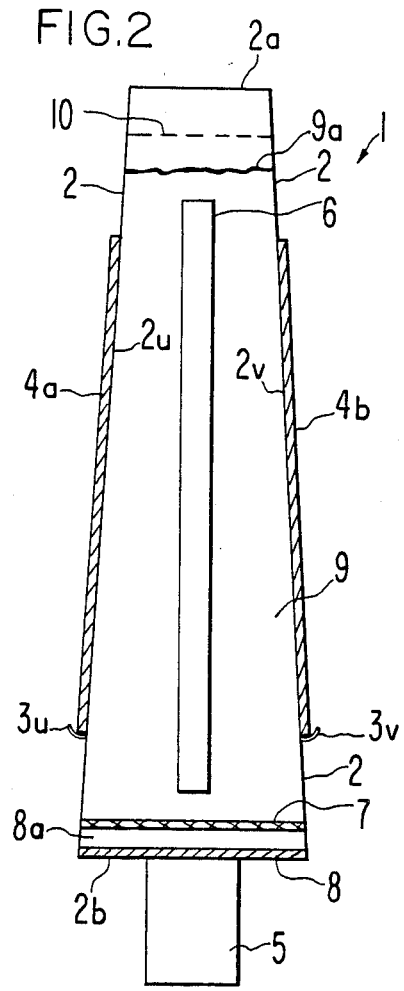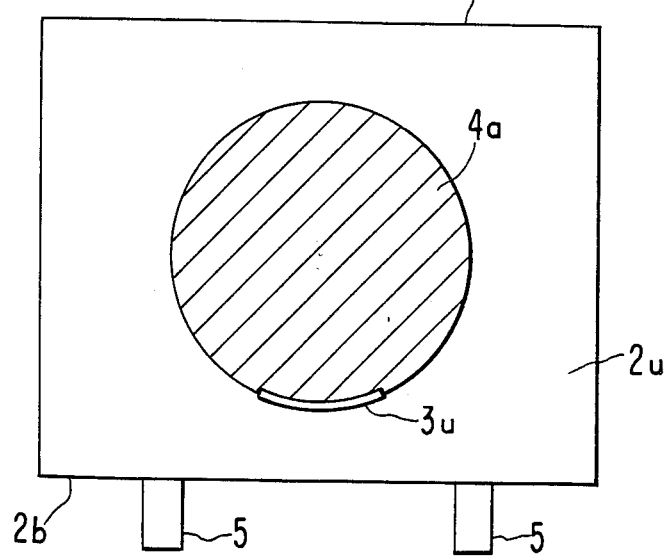

FLUIDIZED BED HEATER FOR SEMICONDUCTOR PROCESSING

FIELD OF THE INVENTION

This invention relates to a fluidized bed heater, and in particular, to a fluidized bed heater apparatus and method for heating semiconductor wafers.

BACKGROUND OF THE INVENTION

A fluidized bed heater consists of a container or housing (mantle) in which a bed of particulate or granular material is placed upon a distribution plate or diffuser. A gas (typically inert) is supplied to a manifold under the distribution plate, which serves to evenly distribute the gas under the plate. The gas penetrates through openings in the distribution plate, passes upward through the bed of granular or particulate material, and finally is exhausted from the heater after clearing the bed.

As the gas flow rate increases through the bed, bed particles, due to drag forces which counteract the force of gravity, begin to lift upwards and the bed exhibits the appearance of a viscus fluid. Thus the bed is said to be fluidized. Heat may be supplied to or removed from the bed by heating or cooling the gas which passes through the bed or by heating or cooling wires or tubes situated in the bed of granular material. Fluidized bed heaters have been used in several industrial processes. For example, U.S. Pat. No. 4,190,235, issued to Dell on Feb. 26, 1980, which is incorporated herein by reference, describes a high-temperature, fluidized bed for sustaining temperatures of at least 2000° C. for heating ladles of the type commonly used in the foundry and steel industry prior to their receiving a charge of molten metal.

Fluidized heaters have also been used in the oil industry. For example, U.S. Pat. No. 4,338,887, issued to Leon on July 13, 1982, which is incorporated herein by reference, describes a low-profile, fluid-bed heater for the steam-flooding process of oil recovery.

SUMMARY OF THE INVENTION

I have discovered that when suitably constructed, a fluidized bed heater may be used to advantage in the processing of semiconductor wafers. A semiconductor wafer is a thin disk-shaped slice of semiconductor material, typically silicon. The diameter of a wafer generally ranges from three to eight inches, though even larger wafers may be used. A plurality of integrated circuits are formed on one of the two planar surfaces of a wafer.

In several important steps in semiconductor processing, for example, for thin-film deposition on a planar surface of a wafer, or for etching previously-deposited layers on the planar surface of a wafer, it is often critical to maintain the temperature of the wafer at a selected temperature $T_1$ with a deviation of at most $\pm \Delta°$ C., where $\Delta°$ typically is a small value such as 1°. The heating must be uniform, that is, the temperature of the entire wafer must be maintained within the selected range ($\pm \Delta°$ C.) of the selected temperature.

It is also important to be able to rapidly heat the wafer to the first selected temperature $T_1$ and to rapidly cool the wafer to a second selected temperature $T_2$.

Therefore, the invention provides a fluidized bed heater for rapidly and uniformly raising the temperature of a semiconductor wafer to a selected temperature $T_1$ $\pm \Delta°$ C., and for rapidly and uniformly cooling the semiconductor wafer to a second selected temperature $T_2$ ($\pm \Delta°$ C.). One embodiment of the fluidized bed heater of this invention includes a mantle having at least a first planar surface for supporting one or more wafers, a bed of particles adjacent the mantle, means for passing gas through the particles so as to fluidize the bed, and a mechanism for heating the bed of particles uniformly so as to maintain a planar surface of the mantle supporting one or more wafers at a first selected temperature. In one embodiment, the mantle of the fluidized bed heater has a generally trapezoidal shape, thus including two planar surfaces each for supporting one or more wafers.

BRIEF DESCRIPTION OF THE DRAWINGS

FIG. 1 shows a partial cross section in sideview of one embodiment of the fluidized bed heater of the present invention;

FIG. 1a shows a front view of the heater shown in FIG. 1.

FIG. 2 shows the cross section of FIG. 1, together with the location of selected heater elements;

DETAILED DESCRIPTION

Figure 3:
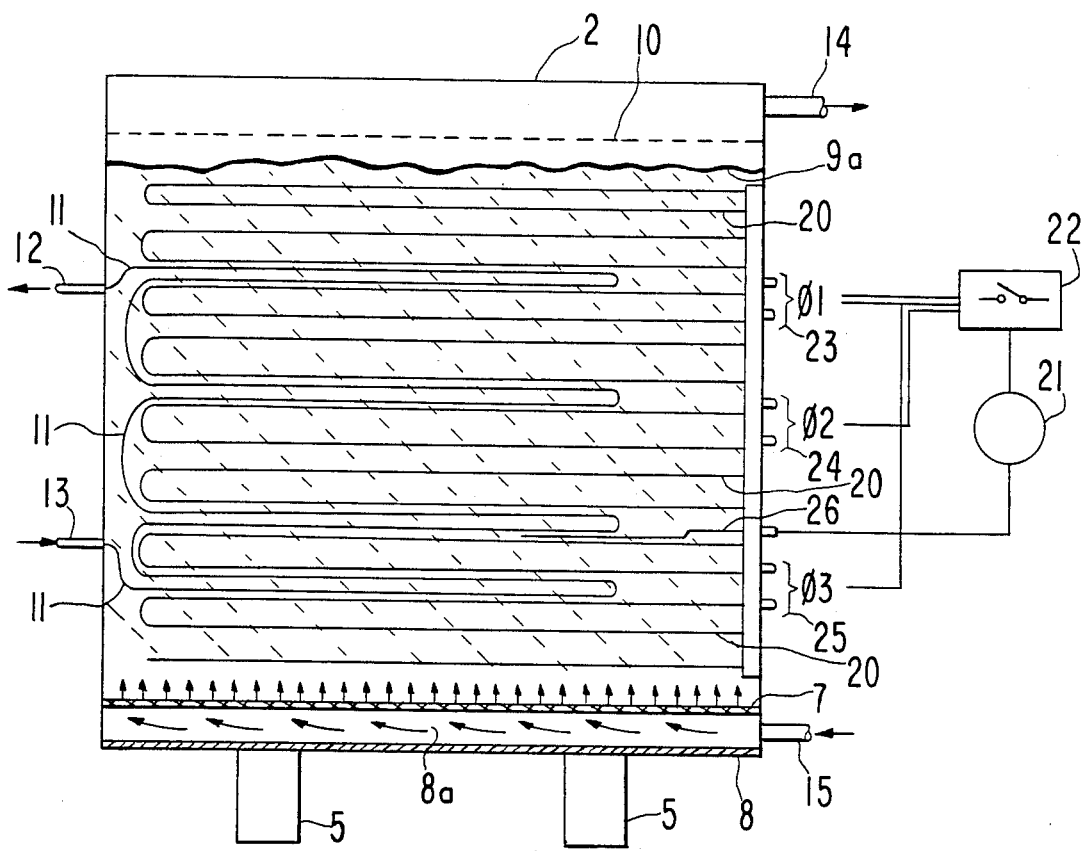
FIG. 3 shows a front view cross section of the heater shown in FIG. 2.

FIG. 1 shows a partial cross section of one embodiment of fluidized bed heater 1 of the present invention. Heater mantle 2, comprising top 2a, base 2b, and planar surfaces 2u and 2v, has a generally trapezoidal cross-sectional shape. Wafer supports 3u and 3v are located on planar rectangular surfaces 2u and 2v near the base of the trapezoid. Base 2b of the trapezoid is supported on base 5. Semiconductor wafers 4a and 4b are shown resting on wafers supports 3u and 3v and against planar surfaces 2u and 2v of mantle 2.

Heater mantle 2 may be made out of a variety of materials, for example, metals, silicon, quartz or graphite. While only two wafers and two wafer supports are shown in FIG. 1, the heater design shown in FIG. 1 may be scaled up to provide a mantle area of several square feet to accommodate numerous wafers on corresponding wafer supports.

FIG. 2 shows the cross section of FIG. 1, together with selected heater elements. Bottom support plate 8 rests on base 5. The fluidizing gas, typically an inert gas such as nitrogen, is introduced under pressure into a plenum chamber 8a between bottom support plate 8 and distribution plate (diffuser) 7. The gas supply may be connected to chamber 8a via base 5 or through a suitable opening (not shown in FIG. 2) in mantle 2 between support plate 8 and diffuser 7. The particles which constitute bed 9 rest upon distribution plate 7. These particles may be made of a wide variety of materials having a wide range of particle size distribution, for example, metal powders, ceramic balls, or sand. In one embodiment of the heater, 40 to 80 mesh particles of alumina are employed. In another embodiment, 10 to 200 mesh sand particles are employed, though even larger particles may be used.

Mesh screen 10 is located above the surface 9a of bed 9 and serves to prevent bed particles from escaping the bed. The mesh of screen 10 is typically smaller than the mean particle size. The presssurized gas passes upward through bed 9, fluidizing the bed, and then through mesh screen 10. The pressurized gas exits the heater by means of an opening (not shown in FIG. 2) in mantle 2 located above mesh screen 10. Rectangle 6 shows schematically the location of the heating and cooling elements in bed 9. These heating and cooling elements are shown in more detail in FIG. 3.

FIG. 3 shows a front-view cross section of the heater shown in side-view cross section in FIG. 2. In FIG. 3, the fluidizing gas enters chamber 8a through opening 15 in mantle 2 located between bottom support 8 and distribution plate 7. The fluidized gas exits the heater through opening 14 in mantle 2 located above mesh screen 10. The heating and cooling elements shown in FIG. 3 are located in region 6 shown in FIG. 2. The cooling elements include tube 11 through which a liquid, e.g. water, is circulated when the bed is being cooled. The water enters through opening 13 in mantle 2 and exists through opening 12 in mantle 2 after flowing through tubular loops indicated schematically by the line 11 in FIG. 3.

FIG. 3 also shows wire heating element 20 which comprises three distinct bundles of wire 23, 24 and 25. Since the trapezoidal bed tapers, (the ratio of the width of the top 2a (FIG. 2) of the trapezoidal mantle 2 to the width of the base 2b of mantle 2 is approximately ½ in one embodiment), it is necessary to provide more power to the heating wires in region 6 (shown in FIG. 2) located near the base 2b of trapezoidal mantle 2, than to the heating wires in region 6 located near the top of trapezoidal mantle 2 in order to achieve uniform heating of the mantle surfaces 2u and 2v upon which the wafers rest. This uniformity of heating of wafer support surfaces 2u and 2v of mantle 2 is accomplished in one embodiment by connecting wire bundle 23 and wire bundle 24 to one phase of the power supply, and wire bundle 25 to a second phase of the power supply. Alternatively, FIG. 3 shows three phases of power applied to wire bundles 23, 24 and 25. Wire bundles 23, 24 and 25 each consist of approximately 10 feet of high temperature resistance wire having approximately 0.060" diameter. The wire in wire bundles 23, 24 and 25 rests on machined ceramic supports (not shown) attached to mantle 2. The amount of current $I_1$ provided to wire bundle 23, the amount of current $I_2$ provided to wire bundle 24, and the amount of current $I_3$ provided to wire bundle 25 is controlled by power switch 22 so that the surface temperature of wafer support surfaces 2u and 2v of mantle 2 is uniform within $\pm\Delta°$ C., where $\Delta°$ is a selected number, for example 1°. Thermocouple 26 senses the temperature of fluidized bed 9 and provides a signal representing this temperature to controller 21 which controls power switch 22. When the temperature sensed by thermocouple 26 reaches a selected temperature $T_1'$ controller 21 causes switch 22 to stop supplying current to heating wire bundles 23, 24 and 25. It is important to note that selected temperature $T_1'$ to which the fluidized bed is heated is generally higher than the selected temperature $T_1$ to which it is desired to heat wafers 4a and 4b resting on surfaces 2u and 2v. This higher temperature is needed in order to allow for the thermal gradient across heater mantle 2 and heat losses.

Due to the trapezoidal shape of mantle 2 and in order to achieve the desired uniformity of surface temperature, it is desirable that more current pass through bundle 25 nearest base 2b of trapezoidal heater mantle 2, than through bundle 23 near the top 2a of trapezoidal heater mantle 2. In one embodiment, it was found that furnishing seven amps of current to bundle 25 and five amps of current to bundles 23 and 24 at an average voltage of 90 volts provided good uniformity of heating for wafer support surfaces 2u and 2v. In general, once the geometry of the trapezoid is fixed, it is easy for one skilled in the art to determine experimentally the current that should be supplied to wire bundles 23, 24 and 25 in order to achieve uniform heating of the wafer support surfaces. Thermocouple 26 continuously monitors the temperature of fluidized bed 9 and provides a signal representing this information to controller 21 so that controller 21 maintains the proper current in bundles 23, 24 and 25 to maintain the desired temperature $T_1'$ in bed 9.

Cooling tube 11 has sufficient capacity to rapidly cool bed 9 to a second selected temperature $T_2'$ which corresponds to a second selected temperature $T_2$ on planar surfaces 2u and 2v.

Once the second selected temperature is achieved, it is maintained by controller 21, switch 22 and thermocouple 26.

Figure 4:
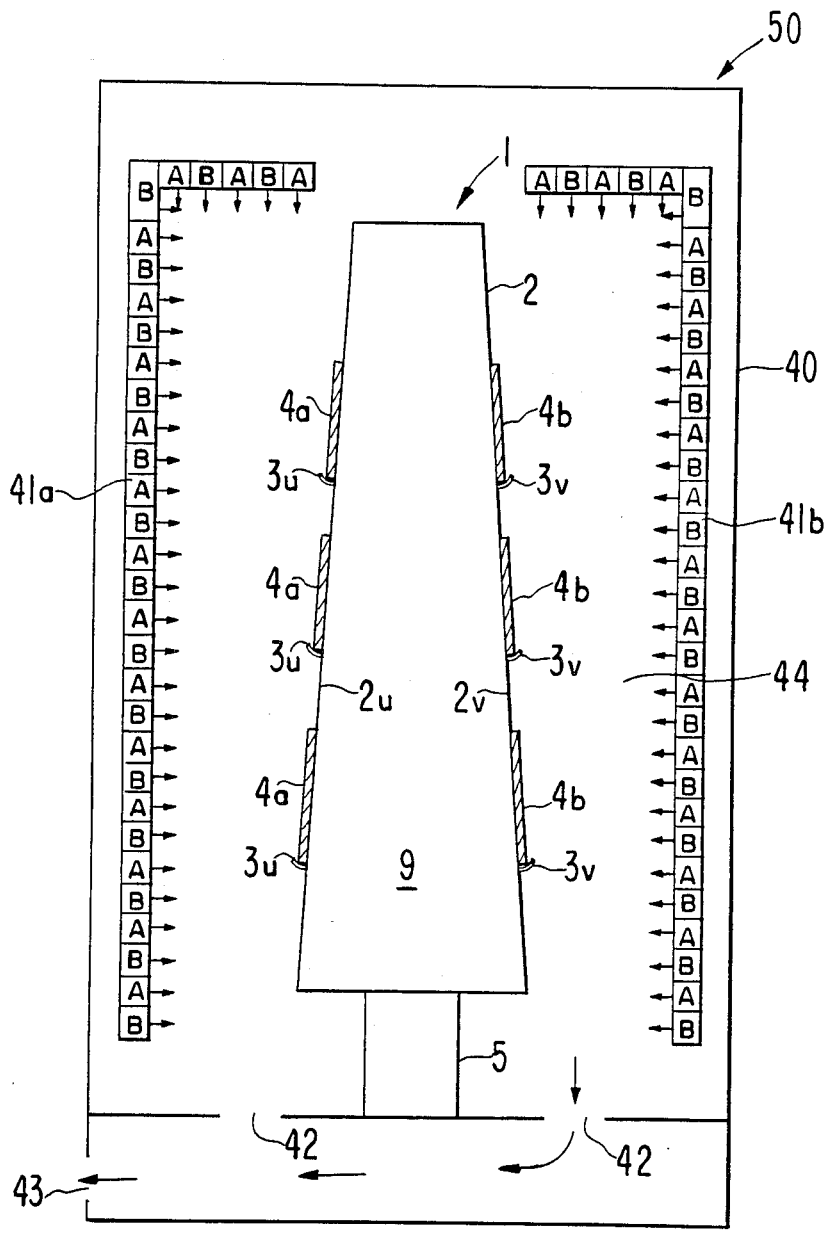
FIG. 4 shows a cross section of a reactor or process chamber containing a fluidized bed heater according to the present invention.

FIG. 4 shows a cross section of a reactor 50 containing fluidized bed heater 1 according to the present invention. Reactor 50 is used for various wafer processing steps, for example, depositing an epitaxial polysilicon film, a dielectric silicon dioxide film, a silicon nitride or a metal film, on the surfaces of wafers 4a and 4b. Reactor wall 40 may be of any suitable material, for example, metal, ceramic or silicon.

Mantle 2 of the fluidized bed heater 1 may be made of any suitable material, for example metal, silicon, quartz, or graphite. However, if made of any one of these latter three materials, heater mantle 2 will generally not withstand a large pressure differential between process or reactor chamber 44 and bed 9 interior to mantle 2. Hence, in these cases, fluidized bed heater 1 should be operated with the same pressure in bed 9 as the pressure in process chamber 44.

The dimensions of mantle 2 may be selected to accommodate several wafers on each planar sidewall 2u or 2v. For example, if a single sidewall 2u is 24"×24", it will accommodate approximately 36 wafers having a 4-inch diameter or approximately 16 wafers having a 6-inch diameter. Mantle 2 typically has two sidewalls that support wafers.

Gas injectors 41a and 41b, which are attached to reactor wall 40 by mountings (not shown) each inject one or more selected gases into reactor chamber 44 within reactor 50. If desired, a heater (not shown) may be used to control the temperature of the selected gases as they enter reactor 50. Injectors 41a and 41b are shown injecting gases A and B into the interior 44 of reactor 50 from alternate chambers.

The gas flow from gas injectors 41a and 41b passes through openings 42 in the base of the reactor and exits the reactor via outlet 43. A vacuum pump (not shown) is attached to outlet 43.

Figure 5:
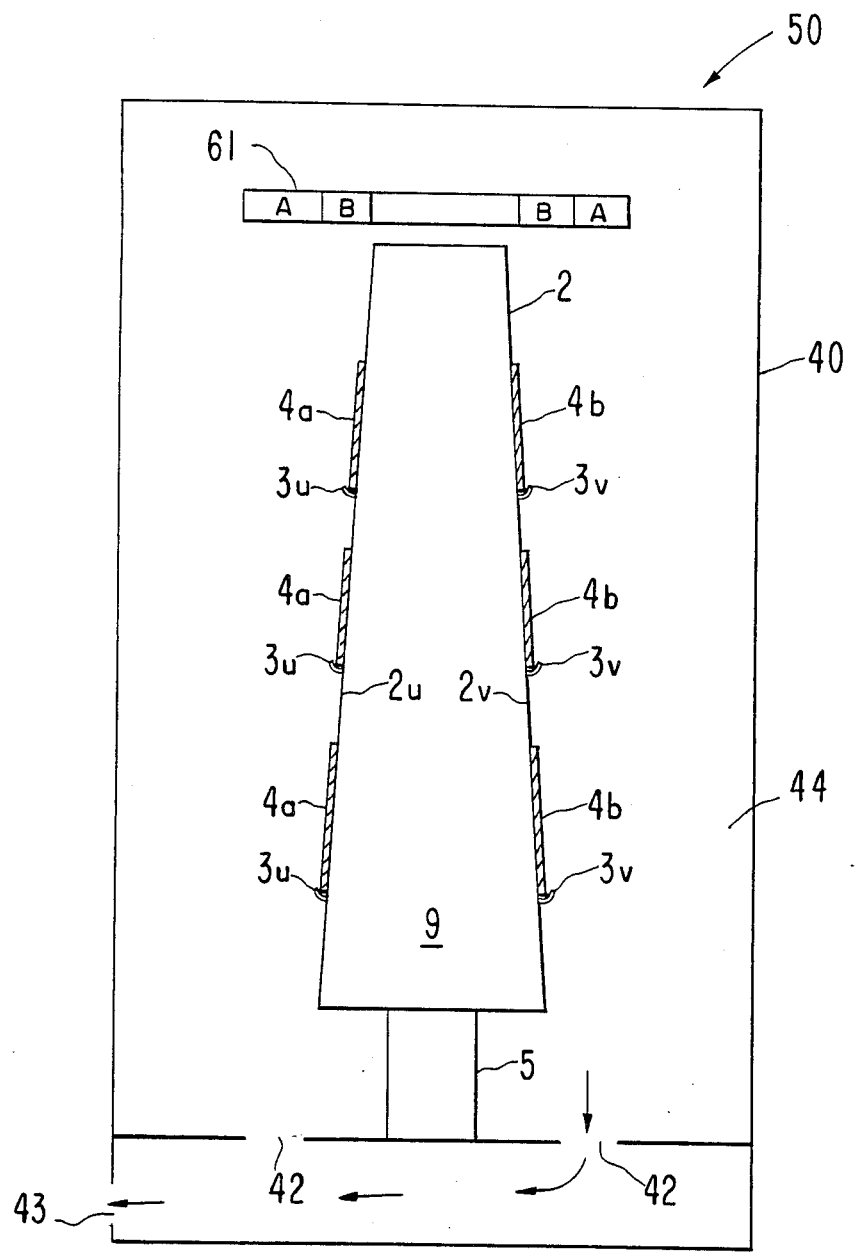
FIG. 5 shows a second embodiment of the reactor shown in FIG. 4.

FIG. 5 shows a second embodiment of reactor 50 which is the same as the embodiment shown in FIG. 4, except that gas injectors 41a and 41b are replaced by gas injector 61 which extends only across the top of the reactor. Gas injector 61, like gas injector 41a, has alternate chambers for injecting gases A and B from gas sources (not shown) into reactor 50.

Figure 6:
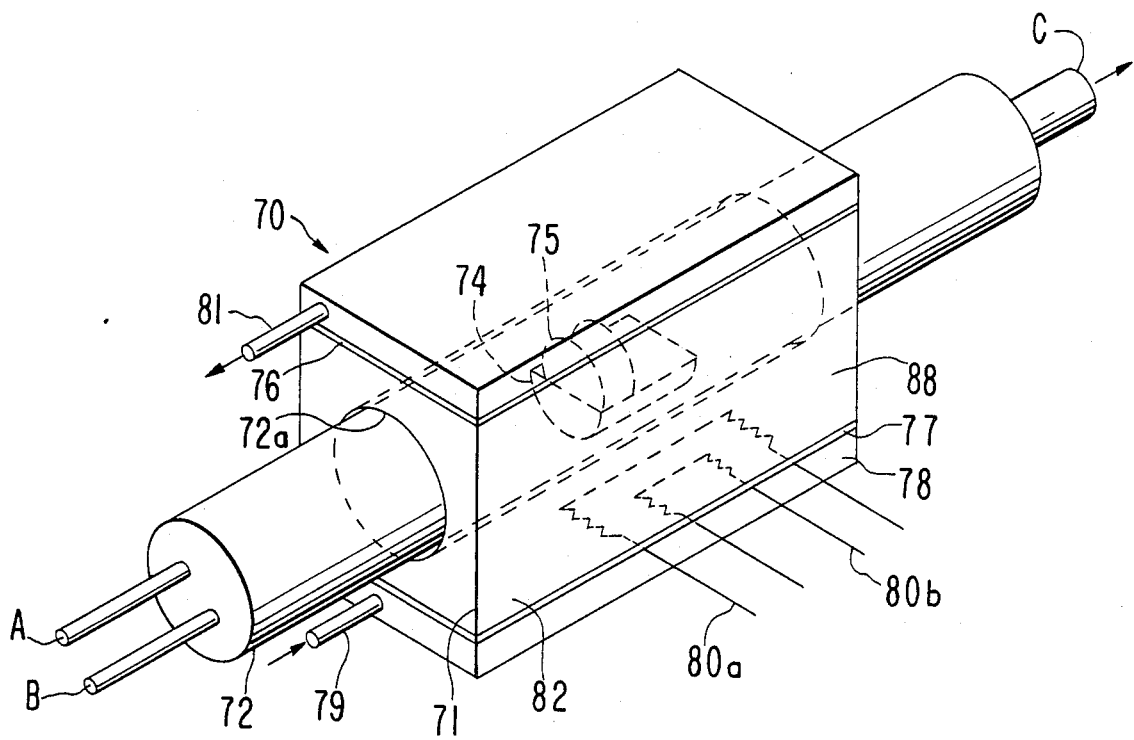
FIG. 6 shows an alternate embodiment of a semiconductor processing reactor according to the present invention.

FIG. 6 shows an alternate embodiment of a semiconductor processing reactor heated by a fluidized bed heater.

FIG. 6 shows a perspective view of reactor 70. Reactor 70 is used for various wafer processing steps, for example, depositing a polysilicon film, a dielectric silicon dioxide film, a silicon nitride or a metal film on the surfaces of wafers 75. Housing 71 contains cylindrical reactor chamber 72. Reactor chamber 72 is supported by support 72a, the interior surface of the circular openings in housing 71 through which reactor chamber 72 is inserted. Selected gases are injected into chamber 72 via tubes A and B located at one end of reactor chamber 72. Tube C located at the other end of chamber 72 is connected to a vacuum pump (not shown) for exhausting gases from process chamber 72.

The gas which fluidizes heater bed 82 of reactor 70 enters chamber 78, which extends the length of the reactor, via port 79. From chamber 78 the gas penetrates through openings in distribution plate 77 and passes upward through bed 82, fluidizing the bed particles contained therein. The gas then passes through mesh screen 76 and exits the reactor via outlet 81. Bed 82 is heated by resistive rods or coils which are indicated schematically by the lines numbered 80a and 80b in FIG. 6. Bed 82 is also cooled by circulating water through cooling tubes (not shown) in bed 82. The bed particles employed in bed 82 are the same as the bed particles employed in bed 9 shown in FIG. 4. The interior surface 72a of housing 71 is typically made of metal and chamber 72 is typically made of quartz. Wafer cassette 74 containing wafers 75 is placed within chamber 72. The temperature within bed 82, and thus within chamber 72, is controlled by a thermocouple mechanism similar to the one shown in FIG. 3. In this embodiment the same amount of current is passed through heating coils 80a and 80b since the reactor geometry is symmetric. The wafers are thus maintained at a selected temperature.

The above embodiments of the invention are meant to be exemplary and not limiting and various modifications and substitutions may be made without departing from the scope of the invention.

I claim:

1. A reactor for processing semiconductor wafers comprising:
   a reactor chamber for containing semiconductor wafers the wafers being mounted on a first side of one or more supports so that one side of each wafer is adjacent a first side of one of said supports and the other side of each wafer is exposed to the environment of the reactor chamber, each support having a second side on which wafers are not mounted; and
   a fluidized bed heater for uniformly heating semiconductor wafers within said reactor chamber by heating the one or more supports on the second side so that the wafers on the first side are heated by heat transferred through the one or more supports.

2. A reactor for processing semiconductor wafers comprising:
   a fluidized bed heater comprising:
     a mantle having at least a first planar surface for supporting one or more wafers;
     a bed of particles adjacent said mantle;
     means for flowing gas through said bed of particles in order to fluidize said bed; and
     means for heating said bed of particles so as to uniformly maintain each planar surface supporting said one or more wafers at a first selected temperature;
   a reactor chamber containing said fluidized bed heater; and
   means for injecting one or more gases into said reactor chamber.

3. A reactor as in claim 2 wherein the pressure in said fluidized bed is the same as the pressure in said reactor chamber.

4. A reactor as in claim 2 wherein said reactor chamber has a top surface and one or more side surfaces, and wherein said means for injecting is located adjacent to said top surface.

5. A reactor as in claim 4 wherein said means for injecting is located adjacent to said top surface and adjacent to said side surfaces.

* * * * *